(12) United States Patent
Lero et al.

(10) Patent No.: US 7,244,088 B2
(45) Date of Patent: Jul. 17, 2007

(54) FOUP DOOR TRANSFER SYSTEM

(75) Inventors: Christophe Lero, Leguevin (FR);
Pierre Astegno, Saint Jory (FR); Alain Gaudon, Launac (FR)

(73) Assignee: RECIF Société Anonyme, Aussone (FR)

( * ) Notice: Subject to any disclaimer, the term of this patent is extended or adjusted under 35 U.S.C. 154(b) by 255 days.

(21) Appl. No.: 10/734,723

(22) Filed: Dec. 12, 2003

(65) Prior Publication Data

US 2005/0063797 A1    Mar. 24, 2005

Related U.S. Application Data

(60) Provisional application No. 60/433,516, filed on Dec. 13, 2002.

(51) Int. Cl.
*B65G 49/07* (2006.01)
(52) U.S. Cl. ............ 414/416.08; 414/757; 414/935; 294/106
(58) Field of Classification Search ............ 294/104, 294/106; 414/217, 935, 416.08, 411, 757, 414/783
See application file for complete search history.

(56) References Cited

U.S. PATENT DOCUMENTS

| | | | |
|---|---|---|---|
| 4,299,533 A | 11/1981 | Ohnaka | |
| 4,897,015 A | 1/1990 | Abbe et al. | |
| 5,046,992 A | 9/1991 | Tamai et al. | |
| 5,168,168 A * | 12/1992 | Luecke | 294/106 |
| 5,178,512 A | 1/1993 | Skrobak | |
| 5,741,113 A | 4/1998 | Bacchi et al. | |
| 5,765,983 A | 6/1998 | Caveney et al. | |
| 5,810,935 A * | 9/1998 | Lee et al. | 118/728 |
| 5,816,770 A | 10/1998 | Itagaki | |
| 5,851,041 A * | 12/1998 | Anderson et al. | 294/106 |
| 5,885,052 A | 3/1999 | Tsuji et al. | |
| 5,984,610 A | 11/1999 | Rush et al. | |
| 5,993,141 A | 11/1999 | Wytman | |
| 6,013,920 A | 1/2000 | Gordon et al. | |
| 6,037,733 A | 3/2000 | Genov et al. | |
| 6,048,162 A | 4/2000 | Molslehi | |
| 6,053,688 A | 4/2000 | Cheng | |
| 6,062,099 A | 5/2000 | Suwa et al. | |
| 6,099,238 A | 8/2000 | Tsubota | |
| 6,102,649 A | 8/2000 | Ogawa et al. | |
| 6,155,131 A | 12/2000 | Suwa et al. | |

(Continued)

FOREIGN PATENT DOCUMENTS

JP    2000 286319    10/2000

(Continued)

*Primary Examiner*—Charles A. Fox
(74) *Attorney, Agent, or Firm*—James F. Hann; Haynes Beffel & Wolfeld LLP

(57) ABSTRACT

A device (12) picks up at least one semi-conductor wafer (11) from a container (14) of wafers fitted on one side (15) of an aperture (13) in the transfer station (10) of a semi-conductor wafer processing plant. The device is on the opposite side (17) of the aperture and the pick-up is effected through it. The device incorporates a shutter (1) movable between open and closed positions. A wafer picking up means (2) is attached to the shutter and is designed to enter partially within the container below a wafer and seize the wafer by its edge. A pick up moving means (3) moves the picking up means (2) back and forth through the aperture (13).

7 Claims, 5 Drawing Sheets

U.S. PATENT DOCUMENTS

| | | |
|---|---|---|
| 6,155,768 A | 12/2000 | Bacchi et al. |
| 6,188,323 B1 | 2/2001 | Rosenquist et al. |
| 6,260,897 B1 * | 7/2001 | Carano .................. 294/26 |
| 6,276,892 B1 | 8/2001 | Haraguchi et al. |
| 6,293,746 B1 | 9/2001 | Ogawa et al. |
| 6,297,611 B1 | 10/2001 | Todorov et al. |
| 6,368,049 B1 | 4/2002 | Osaka et al. |
| 6,468,022 B1 * | 10/2002 | Whitcomb .................. 414/757 |
| 6,470,927 B2 | 10/2002 | Otaguro |
| 6,471,037 B1 | 10/2002 | Matosumoto |
| 6,474,712 B1 * | 11/2002 | Govzman et al. ........... 294/106 |
| 6,485,250 B2 | 11/2002 | Hofmeister |
| 6,517,304 B1 | 2/2003 | Matsumoto |
| 6,533,521 B1 | 3/2003 | Todorov et al. |
| 6,541,787 B2 | 4/2003 | Lin et al. |

FOREIGN PATENT DOCUMENTS

| | | |
|---|---|---|
| WO | WO 98/31514 | 7/1998 |
| WO | WO 00/40379 | 7/2000 |
| WO | WO 00/41855 | 7/2000 |
| WO | WO 00/47501 | 8/2000 |
| WO | WO 00/51920 | 9/2000 |

* cited by examiner

FOUP DOOR TRANSFER SYSTEM

BACKGROUND OF THE INVENTION

The invention is a device to pick up at least one disc-shaped semi-conductor wafer from a container of such wafers fitted on one side of an aperture in the transfer station of a semi-conductor wafer processing plant, the device being situated on the opposite side of the said aperture and the pick-up being effected through it. The device incorporates:

A moving shutter designed to move between a first, closed aperture, position and a second, open aperture, position that allows access to the inside of the container, A means of moving this shutter between these first and second positions, the said movement taking place, at least in part, in a plane approximately parallel to the plane of the aperture.

BACKGROUND ART

Earlier versions of such devices are instructive. One or more containers are fitted to one side of the transfer apertures, more exactly, one container is provided for each transfer aperture. The processing equipment for the semi-conductor wafers housed in the said containers is located on the other side of the transfer aperture. A robot manipulator selects a semi-conductor wafer from within the container on one side of that container's aperture, orientates the wafer and, essentially, brings the wafer to the appropriate equipment on the other side of the aperture. The robot manipulator is attached to the structure used to support or protect the equipment. To allow the robot manipulator to grasp a wafer within the container, each aperture is provided with a mechanism, generally known as the 'shutter', that pulls back a cover closing the semi-conductor wafer container. The inside of the container and the space containing the robot manipulator and the processing equipment are subject to laid-down standards of cleanliness and purity. Accordingly, once the closed container has been attached to the transfer aperture, the transfer aperture's shutter is interlocked with the container's cover. Unlocking the cover and withdrawing it gives access to the inside of the container and simultaneously frees the way to the transfer aperture. The robot manipulator mounted inside the processing equipment space can then access the semi-conductor wafers within all the containers communicating with the processing equipment space by means of their respective transfer apertures.

Such devices have a major disadvantage in that they require considerable space, especially for the location of a robotic wafer manipulator used to access one or more apertures since such a robot takes up a lot of room between the shutter(s) and the wafer processing equipment. Furthermore, space is very expensive in semi-conductor wafer processing installations since it is subject to strict atmospheric purity requirements and any reduction in this space would therefore lead to reduced costs in semi-conductor manufacture.

SUMMARY OF THE INVENTION

The present invention alleviates these disadvantages whilst bringing with it further advantages. More exactly, it refers to a device to pick up, via an aperture in the transfer station of a semi-conductor wafer processing installation, at least one disc-shaped semi-conductor wafer from within a container of semi-conductor wafers located on one side of the said aperture, from the space located on the opposite side of the said aperture, the said device consisting of:

A moving shutter designed to move between a first position, closing the said aperture, and a second position, opening the said aperture and allowing access to the interior of the container, Some means of moving the said shutter between its said first and second positions, the said movement taking place, at least in part, in a plane approximately parallel to the plane of the said aperture.

The said device may be defined as incorporating:

Some means of picking up at least one semi-conductor wafer that is designed to enter partially within the said container below a wafer and pick up the latter by its rim, Some means to move the said pick-ups between the space on the second side of the aperture and the first side, and back again, Some means of linking the pick-up mechanism to the shutter.

The linkage between this pick-up mechanism and the shutter is especially designed to use an existing movement within the wafer processing installation, that of the shutter, to coordinate the shutter with the pick-up mechanism and thus save one discrete movement of the semi-conductor wafer manipulation robot. Each shutter is therefore fitted with its own means of picking up the wafers within the container associated with that aperture. This avoids having to use a large robot wafer manipulator in order to access all the transfer apertures within the combined installation. In this way, a smaller robot manipulator can be used than those employed previously, thus providing shutter-associated space savings.

By way of an advantage, the invented device also incorporates some means of orienting the semi-conductor wafer (s) with the assistance of the pick-ups and pick-up mechanism with the aim of changing the orientation of the said semi-conductor wafer(s).

This feature allows the invented device to orientate a selected wafer with the main aim of aligning its registration notch. This orientation consists of allowing the wafer to rotate within its own plane around its own symmetrical axis at right angles to the plane of the wafer.

By way of an advantage, the mechanism for moving the pick-ups between the space on the second side of the aperture and the first side, and back again, provides a means of transferring a semi-conductor wafer from one side of the said aperture to the other side.

This feature allows the invented device to have the advantageous capability of move a semi-conductor wafer from its container to the processing equipment or vice versa.

By way of an advantage, the said pick up apparatus consists of two moving arms, designed to adopt at least one initial position in which they lie approximately parallel to one another and a second position in which they form a specific angle to one another, such that they form a flat surface to support the semi-conductor wafer.

By way of an advantage, the said wafer pick-ups have at least three rollers connected to the ends of the said two arms by means of freely rotating attachments, such that the said three or more rollers are spaced around the semi-conductor wafer when the two arms are in the second moving arm position.

By way of an advantage, the said two moving arms lie in a plane approximately parallel with the plane of the aperture whilst in their initial position and in a plane at right angles to the plane of the aperture when in the second moving arm position.

By way of an advantage, the mechanism for moving the pick-ups between the space on the second side of the aperture and the first side where the container is located, and back again, incorporates a third arm. This arm carries the said pick-up apparatus at one end whilst the pick-up mechanism's shutter attachment incorporates a joint between the third arm and the shutter at its other end such that the pick-ups can move from one part of the aperture to another.

By way of an advantage, the said three arms are joined together such that they can move, in coordination with the third arm attached to the shutter, in a plane at right angles to the plane of the said shutter. The said pick-up mechanism includes a form of coupling between either the first or second arm and the third arm such that any movement of the third arm induces a movement in the first or second arms to which it is connected.

By way of an advantage, the said coupling is arranged such that it gives the pick-up mechanism a tendency to move the semi-conductor wafer in a direction at right angles to the plane of the aperture.

By way of an advantage, the said first, second and third arms lie in a plane approximately parallel to the plane of the aperture in the initial position of the first and second arms, and along the upper edge of the said shutter.

By way of an advantage, the said first, second and third arms also lie, when in the initial position of the first and second arms, within a space bounded by the two planes of the two external faces of the shutter.

By way of an advantage, the invented device includes a means to deploy automatically whichever of the first and second arms is not linked to the third arm by the said coupling so that it may switch from the initial to the second moving arm position when the third arm moves outside the plane parallel to the plane of the aperture.

By way of an advantage, the said automatic deployment system includes a return spring held in the compressed state when the said first and second arms are in their initial position.

By way of an advantage, the said orientation system includes a friction-drive roller to rotate the rim of the said semi-conductor wafer(s).

By way of an advantage, the said drive roller is integrated with the shutter and the invented device includes a means of moving the drive roller between at least two positions. One of these is known as the 'active' position, in which the roller protrudes and rotates the semi-conductor wafer. In the other position, the said roller is at least partially retracted and allows the movement of the pick-up mechanism from the first side of the shutter to the second side and vice-versa.

By way of an advantage, the invented device includes some arresting system for the pick-up mechanism and the pick-up apparatus when in the initial moving arm position.

By way of an advantage, the said arresting system for the pick-up mechanism and pick-up apparatus is coupled with the said semi-conductor wafer rotary rim drive roller mechanism such that the movement of the drive roller causes the movement of the arresting system.

By way of an advantage, the invented device includes a means of detecting the position of a semi-conductor wafer within its container and also includes a means of measuring the thickness of a semi-conductor wafer.

Further features and advantages will become apparent on reading the description below of a typical method of assembling the invented device, together with the drawings at Annex. This is provided as an example and is not to be considered in any way comprehensive.

BRIEF DESCRIPTION OF THE INVENTION

DETAILED DESCRIPTION OF THE INVENTION

Figure 1:
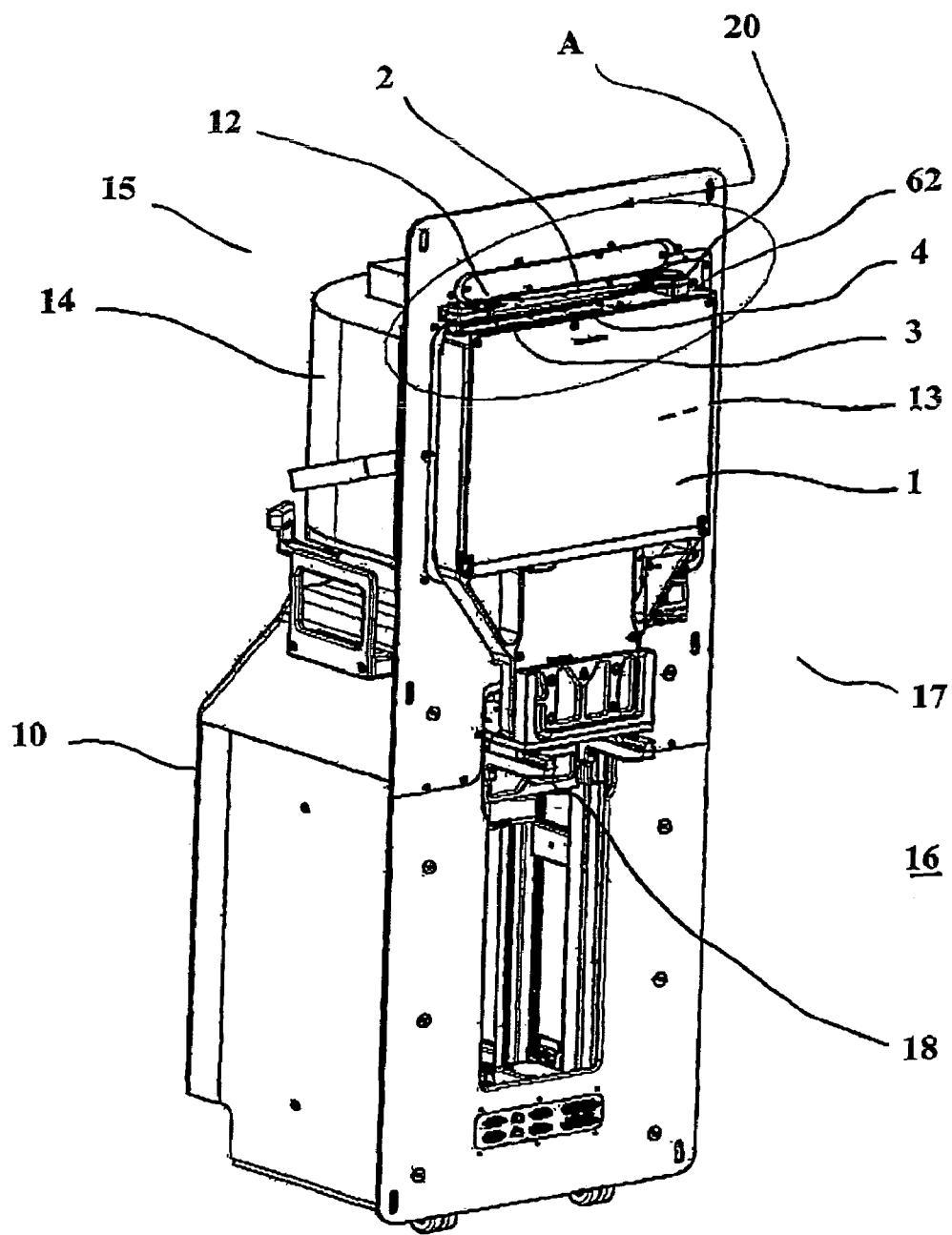
FIG. 1 shows a perspective view of a typical transfer station including an example of one way of configuring the holding invented device in its initial position.
Figure 2:
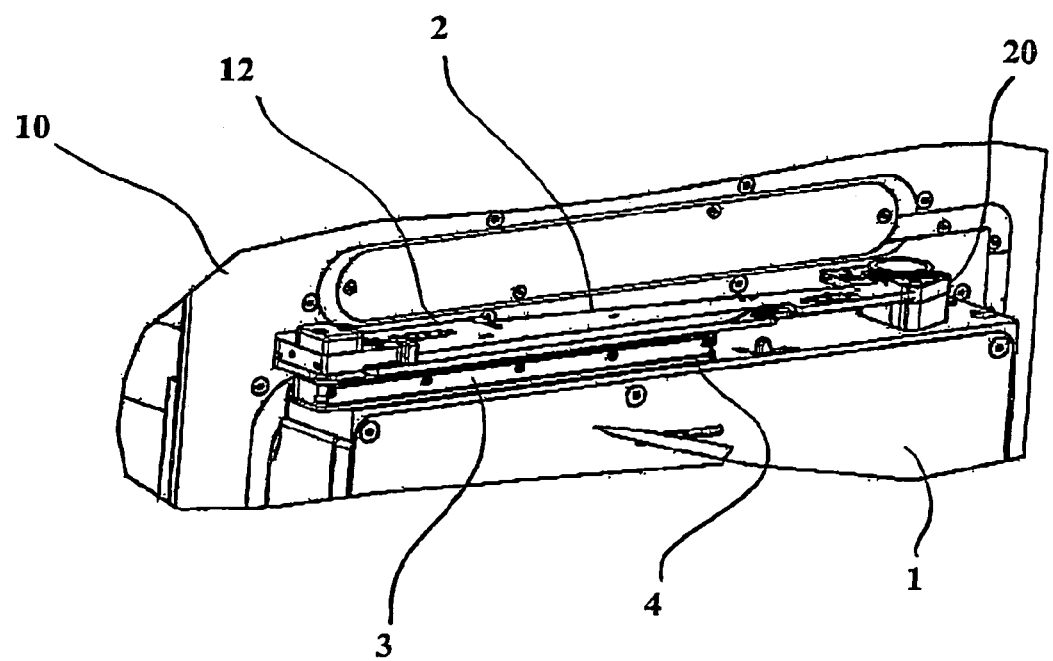
FIG. 2 is an enlarged perspective view taken from detail A of the first view of the example of the holding invented device shown in FIG. 1.

The semi-conductor wafer transfer station (10) shown in FIG. 1 has been deliberately separated from the wafer processing installation (not shown), in order to simplify the diagram, and is shown from the operating space side where the wafer processing equipment (not shown) would be located. The invented pick-up device (12) is used to pick up one or more disc-shaped semi-conductor wafers housed in the semi-conductor wafer container (14) fitted to the first side (15) of the aperture (13), from a space (16) on the other side (17) of the aperture (13) opposite the first side (15), via the aperture (13) of the transfer station (10). The one or more semi-conductor wafers are ideally arranged beforehand in the container (14) in parallel planes at right angles to the plane of the aperture (13). The device (12) consists of:

A moving shutter (1), also known as the 'gate', designed to be moved between an initial position (as shown in FIG. 1), closing the aperture (13) and a second position (not shown), freeing the way to the aperture (13) and allowing access to the inside of the container (14).

Some means of moving (18) the shutter (1) between the initial and second positions, the movement of the shutter being at least partially in a plane approximately parallel with the plane of the aperture (13), eg, a vertical plane and, in this example, the vertical plane in which the shutter runs.

Some means of picking up (2) one or more semi-conductor wafer(s) that is designed to enter partially the container (14) below the wafer to be removed and, ideally, between at least two successive wafers (not shown), picking up the semi-conductor wafer by its rim (19).

Some mechanism for moving (3) the pick-ups (2) between the space (16) on the second side (17) of the aperture (13) and the first side (15), and back again.

Some means of linking (4) the shutter (1) to the mechanism (3) and the pick-ups (2), Ideally, some means of orienting (20) the semi-conductor wafer once seized by the pick-ups (2), coordinated with the latter and the mechanism (3) with the aim of changing the orientation of the semi-conductor wafer.

Neither the shutter (1) or gate, the gate mechanism (18) nor the transfer station (10) generally will be further described here since they are well-known to those working in the business. Similarly, the semi-conductor wafer container (14) is of a well-known type of a standard shape designed to integrate with transfer station apertures. The shutter (1) is generally trapezoidal in shape and placed over the aperture (13) in its initial position in which it is intended to unlock the door of the container (14) and, on moving to its second position, to free the way to the aperture (13). To free the way to the aperture (13), the shutter first moves towards the rear within the space (16) and then makes a downward movement within this space in a plane parallel with the aperture (13). The shutter (1) has a thickness, as shown, of several millimeters, or possibly centimeters, that houses the usual mechanisms (not shown) for freeing the door of the container (14). Generally, it covers an area slightly larger than that of the aperture (13).

The pick-up apparatus (2) and its mechanism (3), the attachment system (4) linking the shutter with the pick-up apparatus (2) mechanism (3) and the orientation system (20) will now be described in greater detail with the aid of FIGS. 3 to 5.

Figure 3:
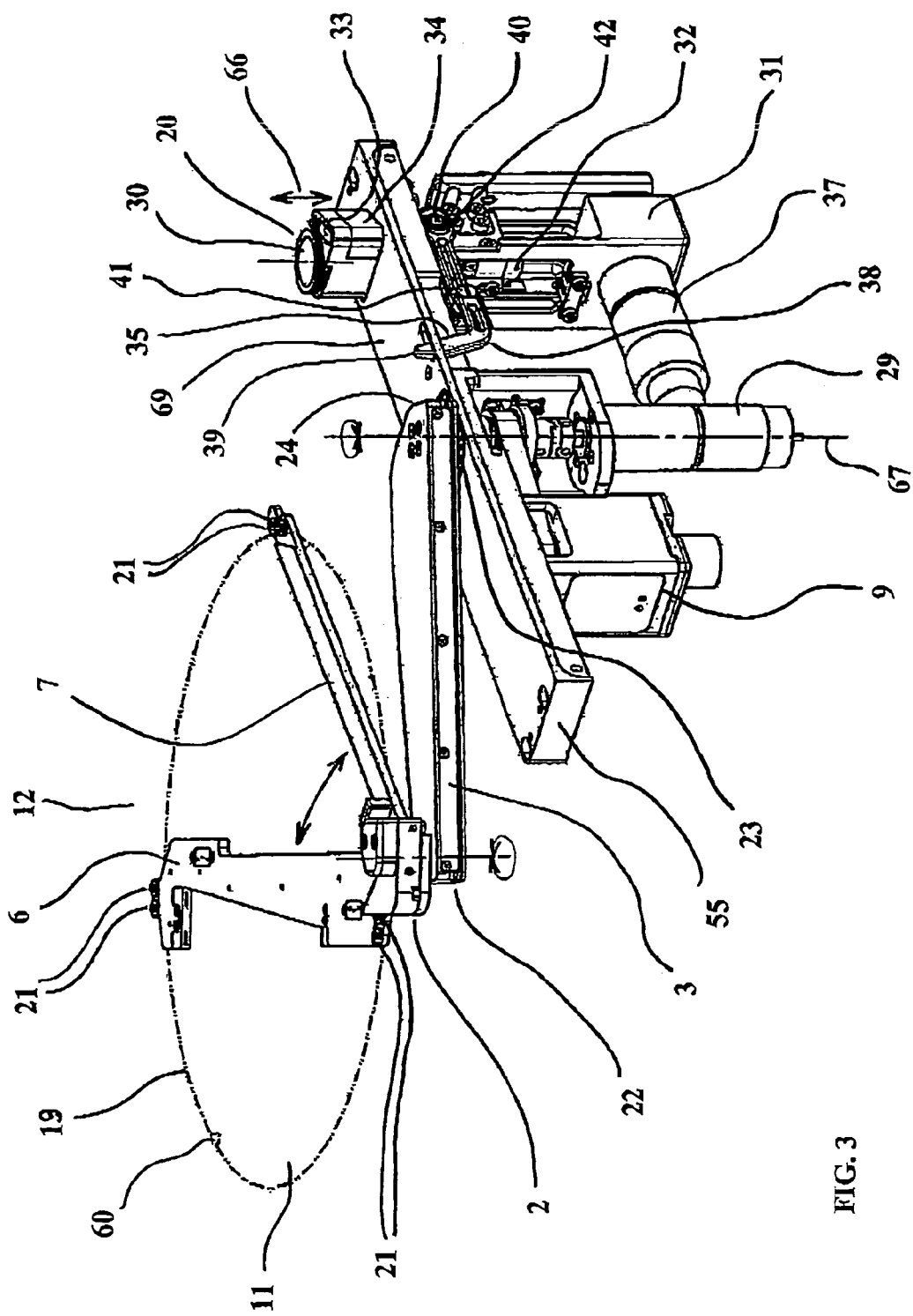
FIG. 3 is a second enlarged perspective view showing details of the holding invented device from FIG. 1, now in the second position.
Figure 4:
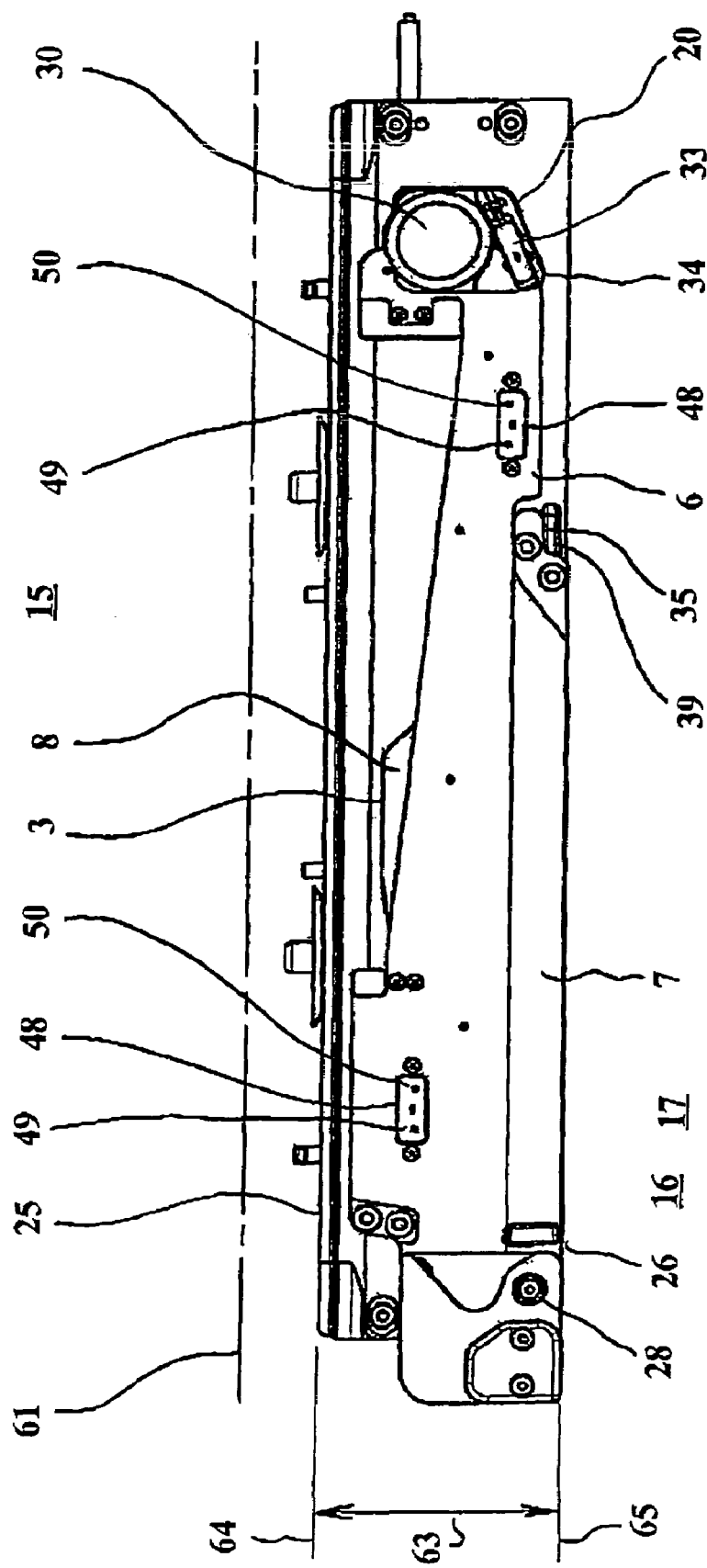
FIG. 4 shows a plan view of the detail in FIG. 2.
Figure 5:
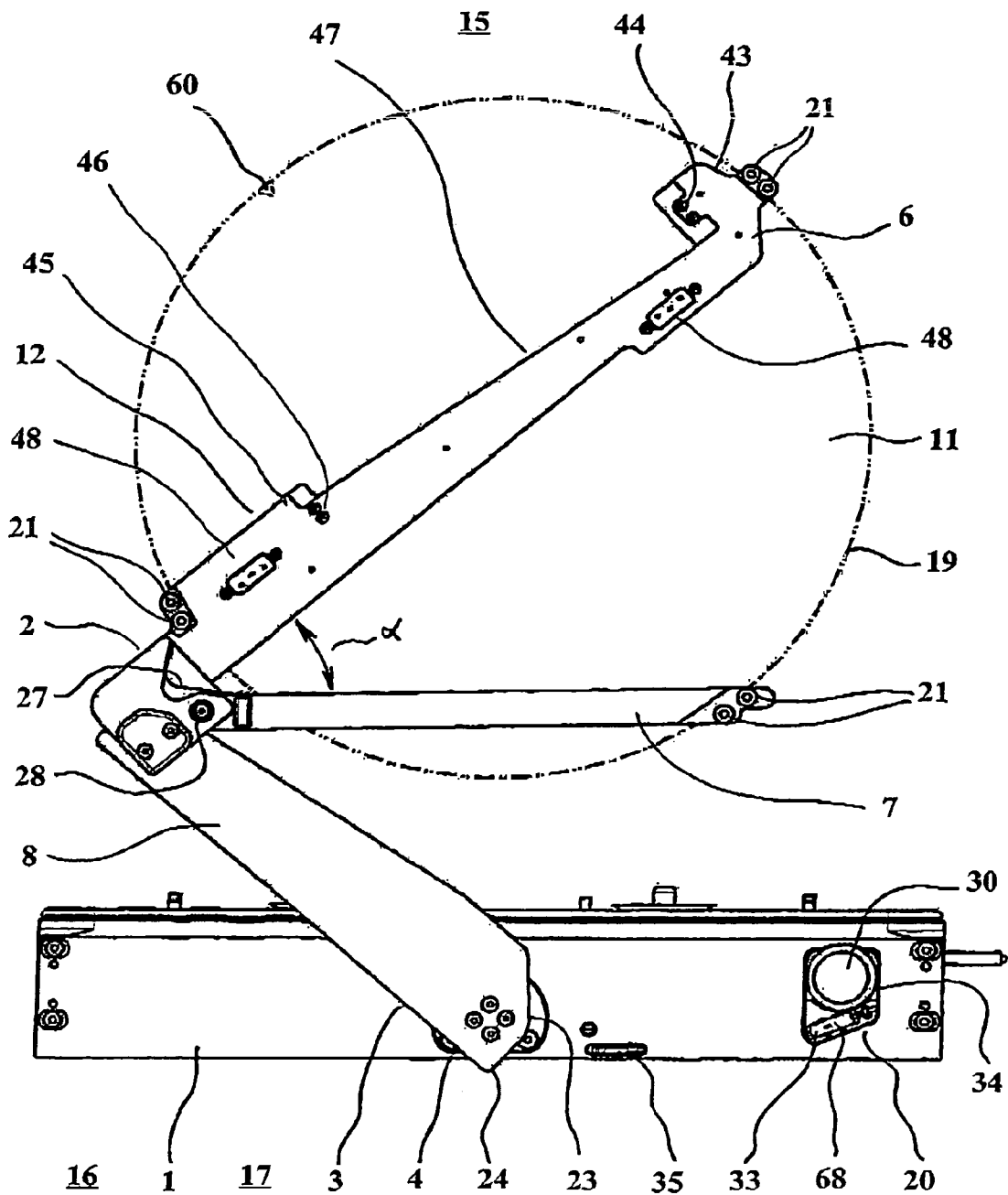
FIG. 5 shows a plan view of the detail in FIG. 3.

As shown in FIGS. 3 and 5, the pick-up apparatus (2) includes two moving arms, a first (6) and a second (7), designed to adopt at least one initial position in which they lie approximately parallel, as shown in FIG. 4, and a second position in which they form a specific angle, α, with one another, as shown in FIG. 5, such that they define a flat surface to support the semi-conductor wafer (11).

The wafer's pick-up apparatus (2) also incorporates, ideally, three pairs of rollers (21) connected to three extremities on the first (6) and second (7) arms by means of a rotating attachment, as shown in FIGS. 3 and 5, such that the three pairs of rollers (21) are spread around the semi-conductor wafer (11) when the first (6) and second (7) arms are in the second moving arm position, thus forming a flat surface to support the semi-conductor wafer (11), as shown in FIG. 5. To this end, as shown in FIGS. 3 and 5, the first arm (6) carries two freely-rotating support rollers (21) at each of its ends whilst the second arm (7) is hinged on the first arm (6) at one of its ends and carries two freely-rotating support rollers (21) at its other end. Thus, in the initial position shown in FIG. 4, the first arm (6) and the second arm (7) are folded back against one another whilst, in the second position shown in FIG. 3 or 5, they are separated from one another in such a way as to define at least three points of support for the semi-conductor wafer (11) in the form of three pairs of support rollers (21). In order to support the wafer (11) and allow it to rotate around its own axis, each roller (21) ideally has a tapered base on which rests the wafer's lower rim surface, and above which is a cylindrical section intended as a rotary stop mechanism for the wafer inside the rollers (21). In the usual manner, the three rotating rollers (21) are paired in order to ensure the correct static equilibrium of the selected wafer in spite of the presence of a notch (60), or some other registration means, on the rim (19) of the wafer (11).

The mechanism (3) for moving the pick-ups (2) between the space (16) on the second side (17) of the aperture (13) and the first side (15) where the container (14) is fitted, and back again, ideally incorporates a third arm (8). This arm carries the pick-up apparatus (6, 7) at one end (22) and the shutter (1) mechanism (3) attachment system, (4) in the form of a joint (23) between the third arm (8) and the shutter (1), at its other end (24) such that the pick ups (6, 7) can move from one part of the aperture to another as described later.

The first (6), second (7) and third (8) arms are jointed together such that they can move in coordination with the joint (23) of the third arm (8) on the shutter (1) in a plane at right angles to the plane of the aperture (13). The pick-up (6, 7) mechanism (3) carries a coupling (not shown) between the first arm (6) and the third arm (8) such that any movement of the third arm will induce a movement of the first arm to which it is coupled. The coupling method, eg, a belt drive (not shown), is arranged inside the arm (8) such that it makes the pick-up (6, 7) mechanism move the semi-conductor wafer (11) through a direction at right angles to the plane of the aperture, typically using a drive belt ratio of 2:1 between arms (6) and (8).

Thus, when in their initial position, the first (6) and second (7) moving arms are folded back against one another and lie in a plane approximately parallel to the plane (61) of the aperture and along the upper edge (62) of the shutter, ideally in the space (63) between the two planes (64 and 65) of the two external faces (25 and 26) of the shutter (1). When they are in the second moving arm position, these arms lie in a plane at right angles to the plane of the aperture due to the rotary joint (23) of the arm (8) whose axis of rotation is parallel to the plane (61) of the aperture (13) or to the planes (64, 65) of the shutter (91), as shown in FIG. 4.

The device (12) as shown also incorporates an automatic system (27) to deploy the second arm (7), that does not have a rotary coupling with the third arm (8) but which is free to rotate on the first arm (6), so that it can change between the initial and second moving arm positions when the third arm (8) moves clear of the space between the planes (64) and (65) parallel to the plane (61) of the aperture. This automatic deployment system ideally consist of a return spring (27), eg, a leaf spring as shown in FIG. 5, held in the compressed state when the first and second arms are in their initial position and set between them such that when the third arm (8) pivots and causes the first arm (6) to rotate, due to its coupling, the second arm (7) can move away from the first arm (6) by pivoting in turn around its own joint (28) on the first arm (6) as the spring (27) relaxes. When it comes up against the stop (not shown but ideally adjustable, eg, a stop-screw), the three groups of rollers (21) will be in the correct position to receive or pick up a semi-conductor wafer, dependent on the angle (α) to the aperture defined as a function of the selected wafer's diameter and the chosen chord distance between the two groups of rollers (21) on the arm (6) needed obtain adequate static and dynamic balance for the wafer.

The mechanism (3) for moving the pick-up apparatus (6, 7) between the space (16) located on the second side (17) of the aperture and the first side (15), and back again, uses the arm (8), ideally pivoting either side of the shutter (1), together with the coupling between the first (6) and third (8) arms, is also designed to transfer a semi-conductor wafer from one side of the aperture (13) to the other side.

The linkage (4) between the third arm (8) and the shutter (1) therefore includes a joint (23) between the arm (8) and the shutter that is able to rotate around an axis parallel to the face of the aperture (13) and at right angles to the planes of the stored semi-conductor wafers (11) in the container (14). An electric motor (29) drives the rotation of the arm (8) in both rotary directions around the joint (23). Ideally, a brake (9) acts on the shaft of the motor (29) so as to stop it, and thus the arm (8), in a given position. Such a braking system avoids the need for continuous control of the motor (29). The brake (9) may consist of collets that clamp onto a shaft rotating with the shaft of the motor (29), these collets being controlled electro-magnetically. The braking system is provided with a position encoder that recognises the position of the arm (8). When the brake is enabled, the arm is immobilised in the chosen position and when the brake is not enabled, the arm (8) is free to move.

The orientation system (20) ideally consists of a rotating friction-drive roller (30) acting on the rim (19) of the semi-conductor wafer (11). The drive roller (30) is integrated with the shutter (1) and the device (12) ideally incorporates some means (31) of moving the roller (30) between at least the two positions, the one known as 'active', in which the roller protrudes and drives the semi-conductor wafer (11) in rotation as shown in FIG. 3, and one other in which the roller (30) is at least partially withdrawn and thus allows the mechanism (3) to move between the first side (15) of the shutter and the second side (17) and back again. The retractable roller (30) may typically be moved in translation along an axis (66) parallel to the axis (67) of the joint (23) on the arm (8) and fitted on the upper edge of the shutter (1). An electric motor (32) integrated with a standard position encoder may be used to rotate the roller (30), whilst an electric motor (37) integrated with a standard position encoder may be used to move the roller (30) along its own axis of translation using a rack and pinion system, for example, by recognition of the roller's (30) position on its movement axis (66).

The orientation of a semi-conductor wafer (11) seized by the pick-ups is achieved in the following manner. The roller (30) is brought to the upper position along its translation axis (66) using the motor (37). Motor (29) moves the arm (8), bringing the semi-conductor wafer (11) up against the roller (30) by rotating the arm (8) until the rim (19) of the wafer (11) touches the roller (30). The roller then rotates the wafer (11) by friction drive. In the usual manner, the device (12) includes sensors to detect the wafer's registration mark, eg, an opto-electronic sensor (68) transmitting a beam of light and detecting its reflection from the wafer's surface until the beam crosses the notch (60) or other wafer orientation mark. To this end, the sensor (68) may be located beside the roller (30), eg, on an attached mounting (34), such that its follows the movements of the roller (30) in translation but lies below the path of the wafer as it rotates to its registration position. Once oriented, the motor (29) moves the arm (8) to release the wafer from its contact with the roller (30), thus allowing the roller to retract in whole or in part within the shutter (1) by means of the motor (37) and the rack and pinion system (in the example). Once the drive roller (30) is at least partially retracted, it is no longer an obstacle to the movement of the arm (8). This arm may then move from one part to the other of the aperture (13) in order to transfer the selected wafer (11). Note that the means used to orientate (20) the wafer (11) against the roller (30) must allow for the subsequent rotation of the wafer (11) after orientation due to the movement of the arms (6) and (8) when positioning it or replacing it in the container (14).

Ideally, the device shown in the diagrams includes some means of arresting (35) the mechanism (3) and the pick-ups (2) in the initial moving arm position. As will be explained, the arresting system for the mechanism and the pick-ups is ideally coupled to the drive roller (30) mechanism (31) such that the movement of the roller causes the movement of the arresting system (35). Typically, the arresting system consists of a lever (38) jointed somewhere around its centre (41) onto the shutter (1), with one end (40) firmly attached to the roller (30), more exactly onto its translation movement mounting (34) by means of a joint (42) at least able to rotate, and, in this example, to move in translation also. The other end of the lever (39) is free to move and protrudes over the upper face (69) of the shutter (1) when the roller (30) is wholly or partially retracted within the shutter. The positions of the shutter (1), lever (38) and roller (30) support (34) connections (41, 42) are respectively defined such that when the roller (30) is in the upper position, driving the wafer (11) in rotation, the free end (39) of the lever (38) is sufficiently retracted within the shutter that it does not obstruct the positioning of the wafer (11) against the roller (30). When the roller (30) is then wholly or partially retracted within the shutter (1) so that the arms may be folded back against one another over the shutter, the end (39) of the lever (38) protrudes above the shutter and across it. This forms a stop for the first (6) and second (7) arm when the motor (29) rotates the third (8) arm and brings the arm (7) against the stop, as shown in FIG. 4. When, during this movement, the arm (7) contacts the free end (39) of the lever (38) protruding above the shutter, the motor (29) continues its rotation such that it compresses the spring (27) lying between the first and second arms until both arms (6, 7) arrive at their initial position as described above; ie, folded back against one another, ideally within a space more or less equivalent to the thickness of the shutter (1). In this position, the pick-ups cannot pick up a wafer and so this forms the 'at rest position' for the device (12). When in this position, the door to the container (14) may be opened or closed.

The device (12) as shown ideally includes some means to detect the presence and position of a semi-conductor wafer within the container (14) and to count the wafers. It might also include some standard means of measuring the thickness of a semi-conductor wafer. The arm (6) may well incorporate a light beam generator (44) at one of its ends (43), such as a light-emitting diode (LED), with a receiver for this beam (46) at the other end somewhere (45), eg, a phototransistor. The arm (6) needs clearance (47) to allow the semi-conductor wafers within the container to break the light beam from the LED (44) when the shutter (1) is moved vertically, moving with it the pick ups on the arm (6), as explained later.

The device (12) as shown ideally includes some means (48) of detecting the presence of a semi-conductor wafer on the pick-ups (2), eg, some optical system consisting of two separate light-beam emitters (49), eg, two light-emitting diodes, and two separate receivers (50) for these beams, eg, two phototransistors, one for each beam.

The device (12) as shown in FIGS. 3 to 5 may be incorporated into any known type of shutter that comes in the form of a hollow trapezoid, as shown in FIG. 1 for instance, where the standard upper part has been replaced by a rigid cover (55) of some suitable shape to enclose the upper part of the shutter whilst forming a rigid structure to support the mechanism (3) for the pick ups (2), the linkages (4) between the shutter (1) and the mechanism (3) and the orientation system described above. Such a shutter is shown best in FIG. 3. The location of these components, their sizes and shapes, are designed in such a way that they may carry out their various design functions as described above and yet be fitted within the free space of the shutter. Thus, the orientation system's support (34) would ideally pass through the rigid cover (55) by means of a transit port, together with the pivot shaft (23) of the arm (8). All the invented device's (12) motion ancillaries, such as the motors (29, 37) and the brake (9) might ideally be fixed under the cover (55) and thus enclosed within the shutter. The only items appearing above the cover being the semi-conductor wafer pick up arms and mechanism, the stop (39) and the retractable orientation system.

The operation of the device (12) described above will now be explained in detail with a description of a typical procedure for which the device (12) might be used:

In a standard manner, a container (14) of semi-conductor wafers (11) is brought up by a transport mechanism (not shown) and placed against the first side (15) of the aperture (13) of the transfer station, In an equally standard manner, the shutter or gate (1) is placed against the door (not shown) of the container (14)

on the second side (17) of the aperture (opposite the first side (15)) in such a way as to open the container by unlocking the door whilst holding the one against the other, The shutter then clears the aperture (13) in a standard manner by means of the mechanism (18) moving away from it in a direction generally at right angles to the aperture and then in a vertical direction towards its second position in order to free the way to the aperture and give access to the wafers inside the container. During these stages, the arms (6, 7 and 8) remain folded over the shutter against the elevated stop (39), the drive roller (30) being retracted into the shutter, During its vertical movement, the shutter may 'sweep' all the wafers such that the sensors (44, 46) used to detect the presence and position of wafers within the container (14) can come into play and detect all the wafers in the container. To achieve this, the arm (8) moves the arm (6) towards the wafers in the container without touching them but such that the wafer sensors (44, 46) can do their job, ie, sense a stack of wafers, The pick-ups (2) may then select a wafer (11) as follows: The shutter withdraws to allow the pick-up arms to deploy by moving the arm (8) towards the interior of the container. This arm is followed by the arms (6 and 7), entering the container below the wafer to be picked up. Arm (7) is then completely free to move as the spring (27) is relaxed and the three groups of supporting rollers (21) are in position to support the wafer (11). Once the arms (6 and 7) are under the selected wafer and the brake (9) has been enabled, the shutter's mechanism (18) can raise the shutter to locate and support the wafer between and over the rollers (21), The selected wafer may then be oriented in the following manner: The arm (8) withdraws the selected wafer from the container (14) after disenabling the brake (9) whilst the roller (30) is raised above the shutter to the upper (wafer orientation) position and the linked stop (39) is lowered accordingly. At the same time, the arm (8) brings the wafer's rim into contact with the roller (30) by means of the motor (29). Typically, the brake (9) is then enabled and the wafer orientated by the motor (32) driving the roller (30) whilst its position is detected by wafer's registration mark sensors (33), The orientated wafer may then be replaced in its container (14) or transferred into the space (16) on the opposite side to the container for processing. To achieve this, the arm (8) moves the wafer away from the roller (30), disenabling the brake (9) so that the roller may be wholly or partially retracted and thus clear the path for the arm (8), where necessary, and the wafer over the shutter. While this is happening, the stop (39) is partially raised but leaves the path clear for the wafer (11) above the shutter. In fact, it is this middle position for the roller (30) and stop (39) mechanism below the wafer that allows the transfer of the wafer from one side to the other of the aperture (13). Note that the extraction of the wafer (11) from its container ideally follows a straight-line path to prevent it touching the walls of the container.

Note too that the invented device may include some means of identifying a wafer, eg, using some standard camera technology with which to recognise wafer markings (not shown). Such a camera might be located in the upper part of the transfer station (10) in such a way as to identify a wafer that might have been brought within range of the camera by means of the shutter (1) during its vertical travel, together with the arm (8).

The typical procedure above is not the only one that might be used with the invented device. Other procedures may of course be used to satisfy the semi-conductor wafers' processing requirements.

The invention claimed is:

1. A device (12) to pick up at least one disc-shaped semi-conductor wafer (11) from a container (14) of such wafers on one side (15) of an aperture (13) in the transfer station (10) of a semi-conductor wafer processing plant, the device being situated in the space (16) on the opposite side (17) of the said aperture, the device incorporating a moving shutter (1) designed to move between a first, closed aperture, position and a second, open aperture, position allowing access to the interior of the container, a means of moving (18) this shutter between these first and second positions, the said movement taking place, at least in part, in a plane approximately parallel to the plane of the aperture, the said device is identifiable in that it incorporates:
    means of picking up (2) at least one semi-conductor wafer (11) by partially entering the container below a wafer and then picking up the wafer by its rim,
    means of moving (3) the said pick-ups (2) between the space on the second side of the aperture and the first side, and back again,
    means of linking (4) the said shutter with the said pick-up mechanism,
    the said pick-ups (2) incorporate first (6) and second (7) moving arms designed to adopt an initial position in which they lie approximately parallel and a second position in which they form a specific angle ($\alpha$) to one another such that they form a flat, support structure for the semi-conductor wafer (11).

2. A device according to claim 1, identifiable in that the said wafer pick-ups (2) incorporate at least three rollers (21) attached to three extremities of the said first (6) and second (7) arms by means of a freely-rotating attachment such that the said three or more rollers are divided around the semi-conductor wafer (11) when the first and second arms are in their said second moving arm position.

3. A device according to claim 2, identifiable in that each of the said at least three rollers (21) has a lower portion, on which rests the wafer's lower rim surface, and an upper portion, engaging the wafer's rim.

4. A device according to claim 2, identifiable in that each of the said at least three rollers (21) has a tapered base, on which rests the wafer's lower rim surface, and an upper cylindrical section, acting as a rotary stop mechanism for the wafer inside the rollers (21).

5. A device according to claim 1, identifiable in that the said first (6) and second (7) moving arms lie in a region vertically above the moving shutter (1) when in their initial moving arm position and in a region laterally offset from the plane of the aperture when they are in their second moving arm position.

6. A device according to claim 1, identifiable in that it incorporates some means of arresting (35) the pick-ups' (2) mechanism (3) and the said pick-ups in the initial moving arm position.

7. A device according to claim 6, identifiable in that the said arresting means (35) for the pick-ups' (2) mechanism (3) and the pick-ups is coupled with the mechanism (31) of the drive roller (30) used to rotate the rim (19) of the semi-conductor wafer(s) such that the movement of the drive roller causes the movement of the arresting system.

* * * * *